(12) United States Patent
Yang

(10) Patent No.: US 7,134,599 B2
(45) Date of Patent: Nov. 14, 2006

(54) CIRCUIT BOARD INSPECTION APPARATUS

(75) Inventor: Wei-Chi Yang, Taipei (TW)

(73) Assignee: Inventec Appliances Corp., Taipei (TW)

( * ) Notice: Subject to any disclaimer, the term of this patent is extended or adjusted under 35 U.S.C. 154(b) by 154 days.

(21) Appl. No.: 10/863,211

(22) Filed: Jun. 9, 2004

(65) Prior Publication Data

US 2005/0274802 A1    Dec. 15, 2005

(51) Int. Cl.
*G06K 7/00* (2006.01)
(52) U.S. Cl. .................. 235/439; 235/375; 235/376
(58) Field of Classification Search ............... 235/380, 235/462.01, 487, 488, 493, 494, 375, 376
See application file for complete search history.

(56) References Cited

U.S. PATENT DOCUMENTS

| | | | | |
|---|---|---|---|---|
| 5,003,251 A | * | 3/1991 | Fuoco | 324/764 |
| 5,740,066 A | * | 4/1998 | Suppelsa et al. | 716/1 |
| 6,360,950 B1 | * | 3/2002 | Hoover-Szendre | 235/462.45 |
| 6,365,860 B1 | * | 4/2002 | Beffa | 209/573 |
| 6,400,840 B1 | * | 6/2002 | Wilson et al. | 382/145 |
| 6,588,854 B1 | * | 7/2003 | Wilson et al. | 702/145 |

\* cited by examiner

*Primary Examiner*—Thien M. Le
*Assistant Examiner*—Daniel A. Hess
(74) *Attorney, Agent, or Firm*—Troxell Law Office, PLLC

(57) ABSTRACT

A circuit board inspection apparatus aims to inspect a circuit board panel which contains a plurality of sub-panels. The panel is bonded with a panel barcode and each sub-panel is bonded with a different sub-panel barcode. The circuit board inspection apparatus includes an automatic optic inspection (AOI) system to inspect the circuit board panel and read the panel barcode and the sub-panel barcode, a data link module to link data contained in the panel barcode and the sub-panel barcode and generate linkage data, and a database to store the linkage data. The relationship of the panel and the sub-panel may still be maintained through the linkage data provided by the data link module even after the panel and the sub-panel have been separated.

4 Claims, 5 Drawing Sheets

| Batch number | Panel barcode | Sub-panel barcode | Repair records | Serial number of repair man |
|---|---|---|---|---|
| | | | | |
| | | | | |
| | | | | |
| | | | | |

FIG.6

CIRCUIT BOARD INSPECTION APPARATUS

BACKGROUND OF THE INVENTION (1) Field of the Invention

The present invention relates to a circuit board inspection apparatus and particularly to an automatic inspection apparatus for handset circuit boards.

(2) Description of the Prior Art

Automatic optic inspection (AOI) has been successfully applied on the production lines of printed circuit board (PCB) after nearly ten years of research and development. With the circuit elements increasingly miniaturized and condensed, surface mount technology (SMT) factories in the PCB manufacturing industry have to adopt AOI apparatus on the production lines. This is because the small and condensed electronic elements on the circuit board can no longer be identified by operator's eyes on the production lines. AOI system provides a reliable and consistent inspection, and keeps accurate inspection records. In addition, the AOI system can execute the inspection repeatedly and accurately. The inspection scope includes whether the elements have void soldering, short circuit, deformation or shortage, and whether the elements are soldered properly without deviation or uneven solder paste distribution. Finally computers are used to store, analyze and process the inspection results.

The handset main board fabrication process also needs the help of AOI system. As the size of the handset shrinks continuously, the main board also shrinks. To rely on human eye to inspect whether the elements are precisely and properly soldered on the main board is very difficult and inefficient. Hence the AOI system becomes the only and most efficient equipment. However, there are still problems when using the AOI system to inspect the handset main boards as indicated below.

Refer to FIG. 1 for a handset main board (abbreviated panel 10 hereinafter) which generally contains four identical sub-panels 12 (ranging from 4 to 12 sub-panels). Each sub-panel 12 has many surface mount devices(SMD) (not shown in the drawing) soldered on the upper and lower surfaces thereof. The panel 10 has to go through an inspection process to check whether the devices are accurately soldered on each sub-panel 12.

Refer to FIG. 2 for a conventional panel inspection process. First, inspection of the upper surface of a panel is executed. The process includes: bonding a barcode 14 on the upper surface of the panel 10(step 101); next, performing inspection through an AOI system (step 102); the AOI system determining whether defects are found on the soldered elements of the sub-panel 12(step 103) and at the same time reading the barcode 14 of the panel 10; performing manual inspection if the AOI system determines any soldered element on any sub-panel 12 is defective (step 104); confirming again abnormal conditions of the soldered elements on the sub-panel 12(step 105); proceeding panel repair process if the inspection result proves the defect existed and generating repair records (step 106); continuing inspection of the lower surface of the panel 10 if no defect is found in the upper surface inspection.

At step 103, if it is determined that there is no defect on the soldered elements of the sub-panel 12, directly proceed the inspection of the lower surface of the panel 10 (step 107 to step 113). The processes are same as those previously discussed, details are omitted. The barcode 14 of the panel 10 mainly aims to identify the panel 10 and link to the inspection and repair records of the panel 10 for the follow on process and analysis. However, in the later stage processes, after the panel 10 and the sub-panel 12 are separated, the individual sub-panel cannot be identified with its original panel. As a result, the corresponding inspection records are useless. In view of this problem, the present invention aims to provide a circuit board inspection apparatus that can link the inspection records of the panel to the corresponding sub-panel after they are separated.

SUMMARY OF THE INVENTION

The primary object of the invention is to provide a circuit board inspection apparatus.

The circuit board inspection apparatus according to the invention is for inspecting a panel which has a plurality of sub-panels (the number of the sub-panel ranges about from 4 to 12). The panel is bonded with a panel barcode, and each sub-panel also is bonded with a different sub-panel barcode. The circuit board inspection apparatus includes an AOI system, a data link module and a database. The AOI system inspects the circuit board of each sub-panel and reads the data of the panel barcode and sub-panel barcode. The data link module links the data of the panel barcode and the sub-panel barcode and generates linkage data. The database stores the linkage data that may include data fields such as batch number, data of the panel barcode and sub-panel barcode, repair records and the serial number of a repair technician. Through the linkage data provided by the data link module, the relationship of the panel and each sub-panel can be maintained even after the panel and the sub-panel have been separated.

BRIEF DESCRIPTION OF THE DRAWINGS

The present invention will now be specified with reference to its preferred embodiment illustrated in the following drawings.

FIG. 6 is a data record format stored in the database according to an embodiment of the invention.

DESCRIPTION OF THE PREFERRED EMBODIMENT

The present invention provides a circuit board inspection apparatus and particularly an automatic inspection apparatus for handset circuit boards. In the invention the panel and its fore-connected sub-panels are respectively bonded with a barcode so that the circuit board inspection apparatus can link the barcode data of the panel and the sub-panels stored in the database even after the panel and the sub-panels are separated at the later stage processes. Details are elaborated as follows by referring to an embodiment. It is to be noted that the embodiment serves for illustrative purposes and does not limit the invention.

Figure 1:
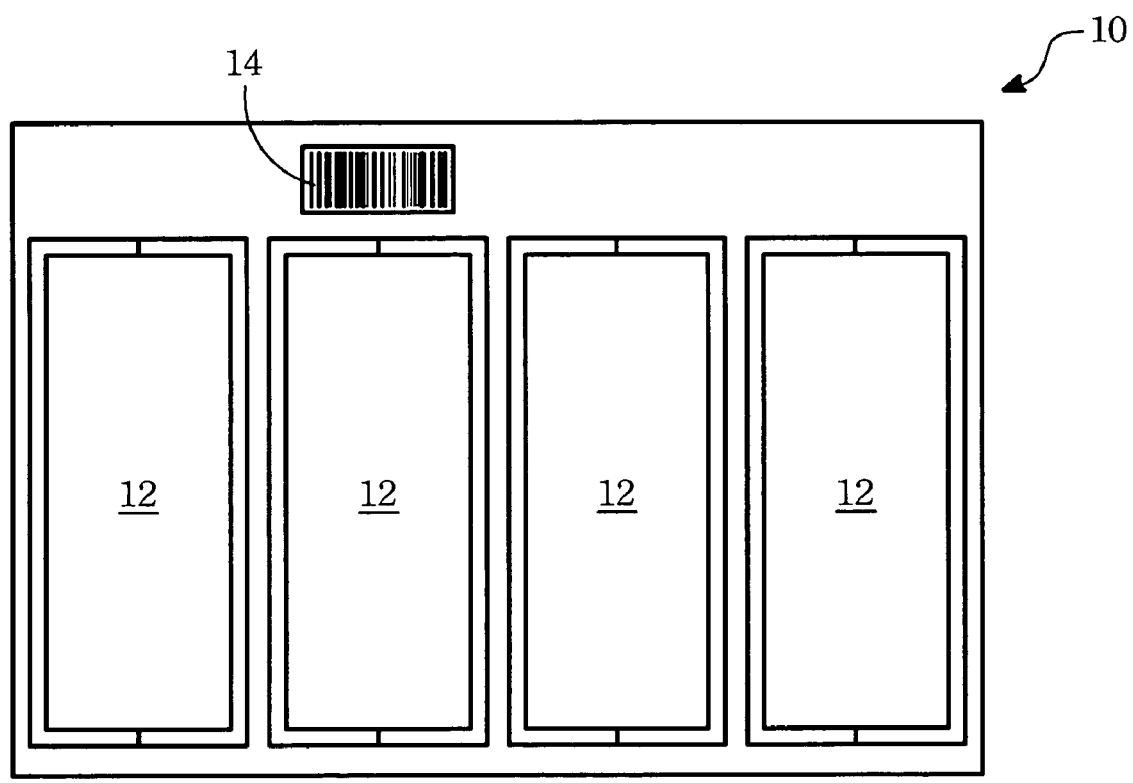
FIG. 1 is a schematic view of a panel pending to be inspected.
Figure 2:
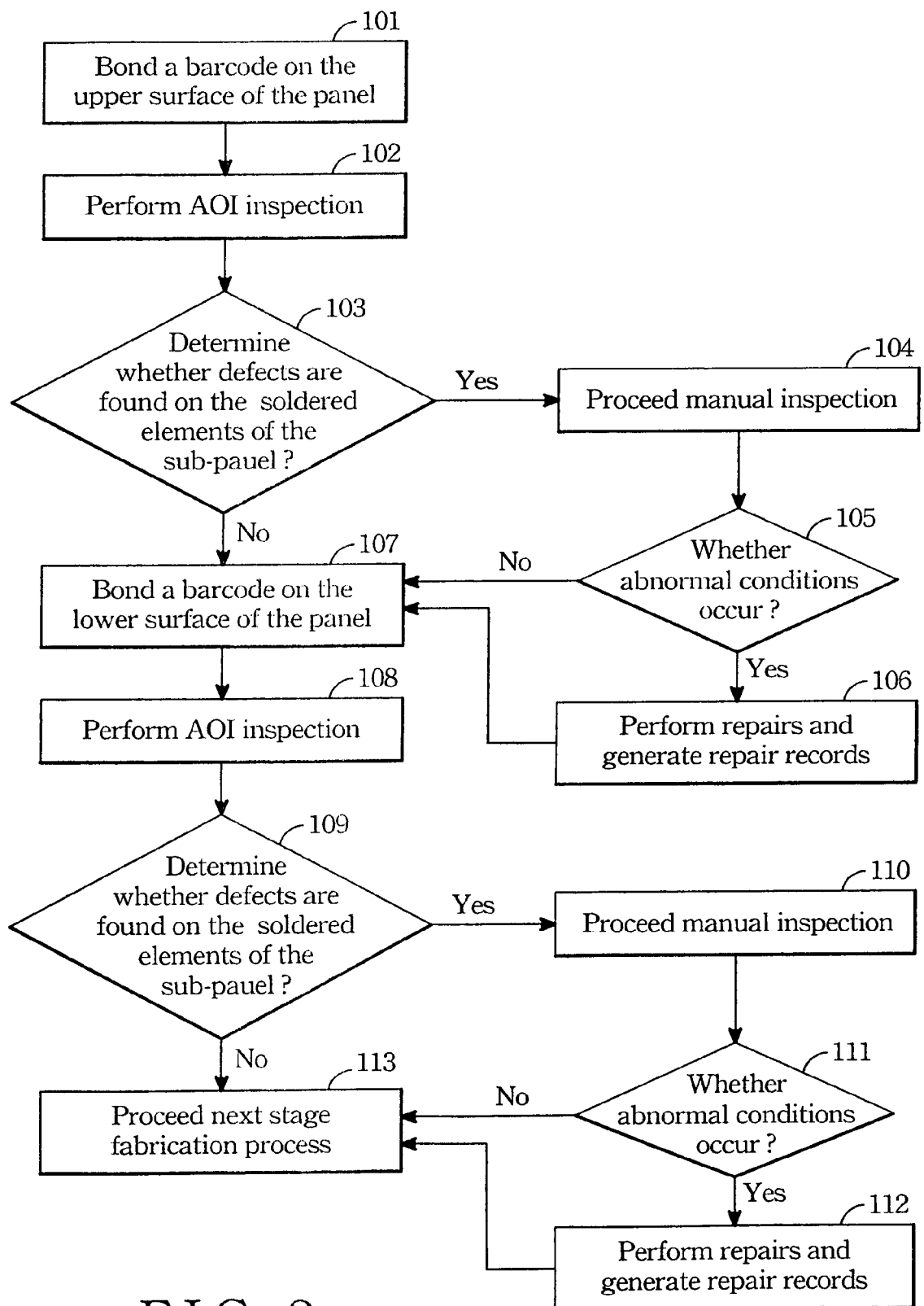
FIG. 2 is a flow chart of a conventional panel inspection process.
Figure 3:
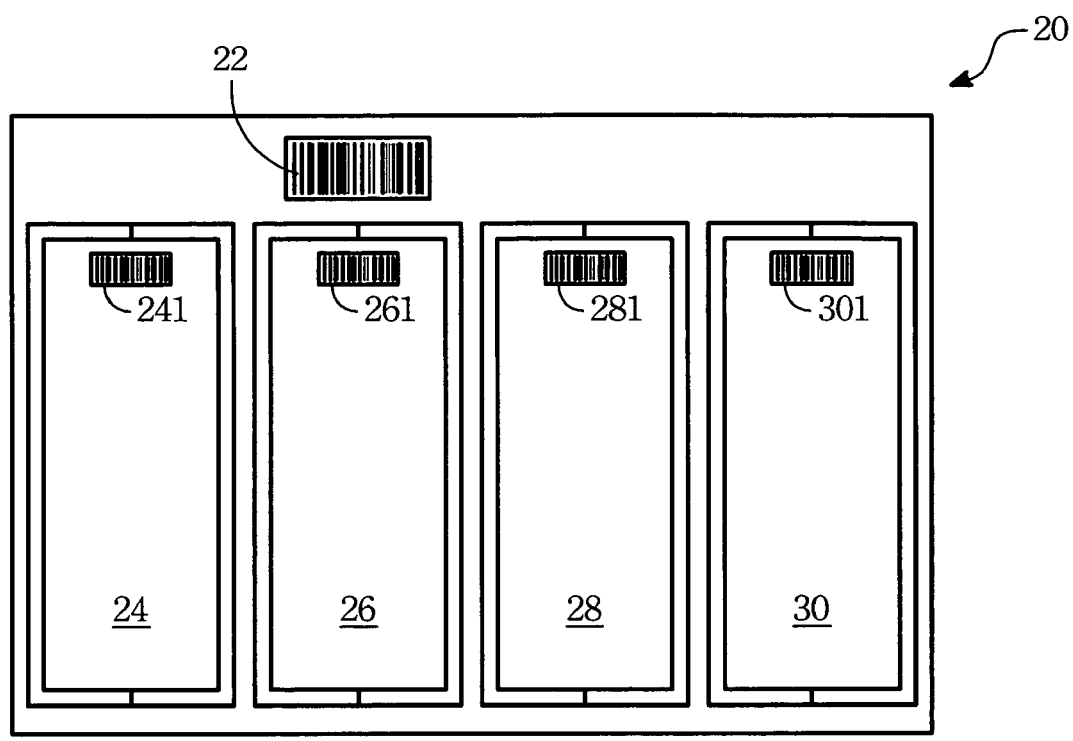
FIG. 3 is a schematic view of an embodiment of a panel pending to be inspected according to the invention.

Refer to FIG. 3 for an embodiment of the barcodes used in the invention. A panel 20 contains four identical sub-panel 24, 26, 28 and 30 (the number of the sub-panel ranges about from 4 to 12). Each sub-panel has many SMDs (not shown in the drawing) soldered on the upper and lower surface thereof the panel 20 has a panel barcode 22 bonded thereon. The sub-panels 24, 26, 28 and 30 have respectively a sub-panel barcode 241, 261, 281 and 301 bonded thereon for identification and recording and linking repair records to facilitate inspection of the circuit board.

Figure 4:
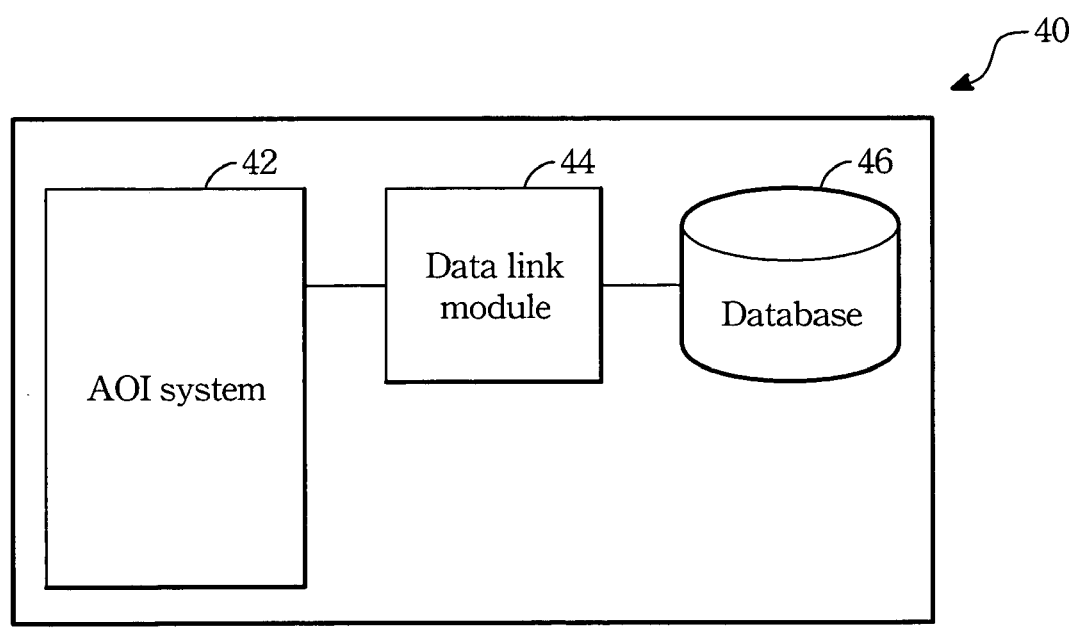
FIG. 4 is a functional block diagram of the circuit board inspection apparatus of the invention.

Refer to FIG. 4 for the functional block diagram of the circuit board inspection apparatus of the invention. The circuit board inspection apparatus 40 includes an AOI system 42, a data link module 44 and a database 46. The AOI system 42 aims to inspect whether elements are properly soldered on the circuit board, and read the data of the panel barcode 22 and the sub-panel barcodes 241, 261, 281 and 301. The data link module 44 links the barcode data of the panel barcode 22 and the sub-panel barcodes 241, 261, 281 and 301, and generates linkage data. The database 46 stores the linkagedata. The database 46 may be reside in the memory (not shown in the drawing) of the circuit board inspection apparatus. In addition, the programs required in the data link module may also be stored in the memory too. Hence through the linkage data of the data link module 44, the relationship of the panel 20 and the sub-panel 24, 26, 28 and 30 may be maintained even after they are separated.

Figure 5:
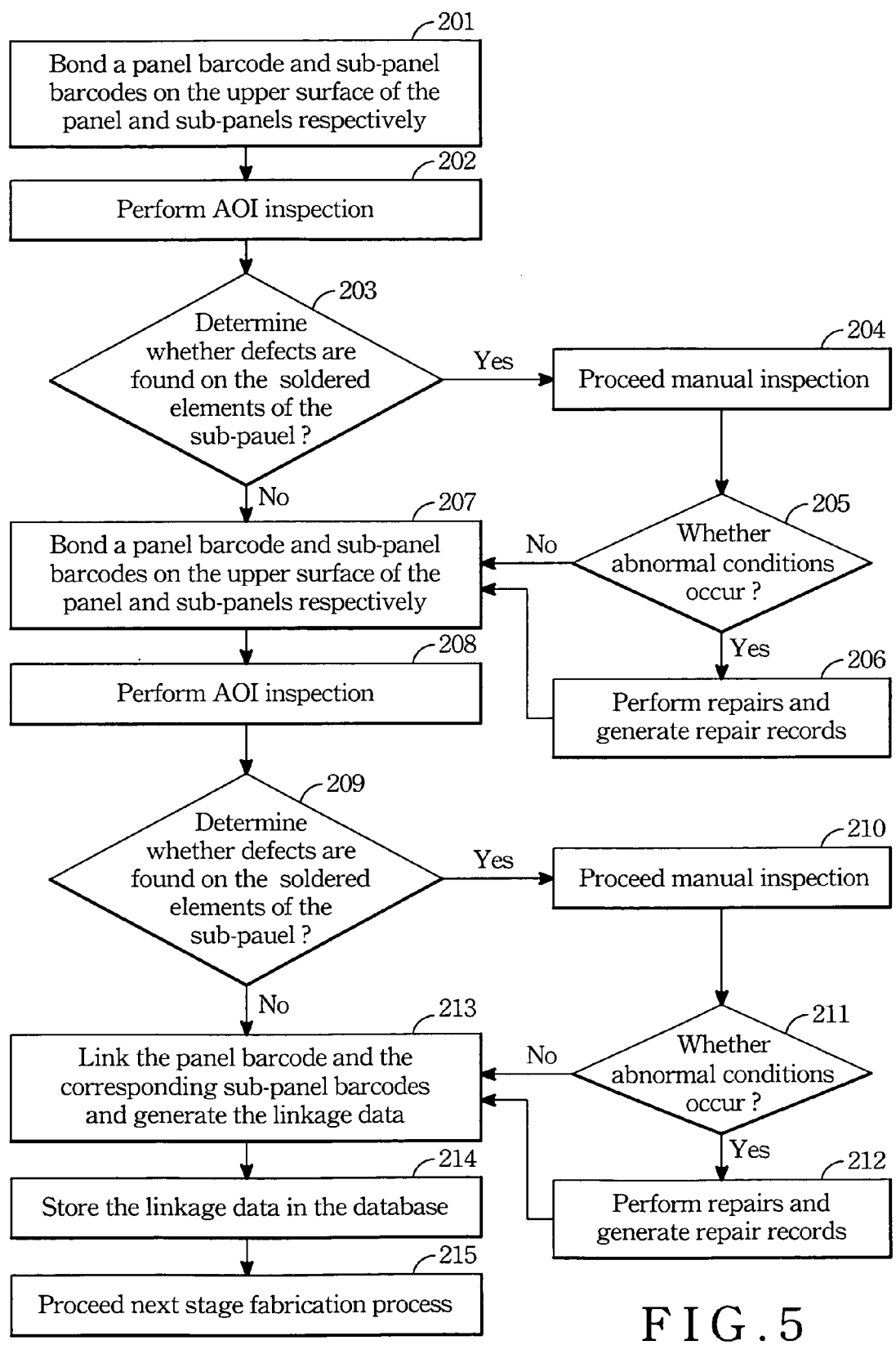
FIG. 5 is a flow chart of an embodiment of the panel inspection process of the invention.

Refer to FIG. 5 for the panel inspection process of an embodiment of the invention. First, inspection of the upper surface of the panel is executed. The process includes: bonding a panel barcode and sub-panel barcodes on the upper surface of the panel and sub-panels respectively(step 201); next, performing inspection through the AOI system 42 (step 202); and AOI system 42 determining whether defects are found on the soldered elements of each sub-panel (step 203) and at the same time reading the barcodes of the panel and sub-panels; performing manual inspection if the AOI system 42 determines any soldered element on any sub-panel is defective (step 204); confirming again abnormal conditions of the soldered elements on the sub-panel (step 205); proceeding to panel repair process if the inspection result proves the defect existed and generating repair records (step 206); recording the repair records (including inspection records and serial number of repair technician), and continuing inspection of the lower surface if no defect is found in the upper surface inspection.

At step 203, if it is determined that there is no defect on the soldered elements of each sub-panel, directly proceed the inspection of the lower surface of the panel (step 207 to step 212). The processes are same as those previously discussed; details are omitted. It is to be noted that when the AOI system 42 determines that both the upper surface and the lower surface of the panel are normal (or abnormal condition was detected and has been recorded by the repair technician), the data link module 44 links the barcode data of the panel and the barcode data of the corresponding sub-panels, and generates linkage data (step 213) then the linkage data is stored in the database 46 (step 214) to complete the circuit board inspection process. Thereafter, the fabrication process of the next stage is activated (step 215).

Refer to FIG. 6 for the data record format stored in the database according to an embodiment of the invention. The database 46 includes data fields such as batch number, panel barcode data, sub-panel barcode data, repair records, serial number of repair man, and the like. Thus the relationship records of the panel and sub-panel, and the related repair records are maintained for quality assurance and analysis in the follow on processes.

The circuit board inspection apparatus thus constructed has many advantages, including that the barcodes bonding to the panel and sub-panel can be linked by the data link module to generate linkage data so that the relationship of the sub-panel and corresponding panel can still be obtained even after they are separated. The linkage data include repair records, batch records, and the like. Hence in the follow on processes even if the panel and sub-panel are separated, any defect being detected on the sub-panel that is related to the AOI system can be tracked through the linkage data to locate the related sub-panels and even the involved same batch. If this can greatly improve troubleshooting efficiency.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

I claim:

1. A circuit board inspection apparatus for inspecting a circuit board panel which contains a plurality of sub-panels, the panel being bonded with a panel barcode and each sub-panel being bonded with a different sub-panel barcode, the inspection apparatus comprising:

an automatic optic inspection system to inspect the circuit board panel and read the panel barcode and each sub-panel barcode;

a data link module to link data contained in the panel barcode and each sub-panel barcode and generate linkage data; and a database to store the linkage data;

wherein the relationship of the panel and each sub-panel is maintained through the linkage data provided by the data link module even after the panel and each sub-panel have been separated.

2. The circuit board inspection apparatus of claim 1, wherein the number of the sub-panels ranges from four to twelve.

3. The circuit board inspection apparatus of claim 1, wherein the sub-panels are handset main boards.

4. The circuit board inspection apparatus of claim 1, wherein data fields stored in the database include batch number, panel barcode data, sub-panel barcode data, repair records, and serial number of a repair technician.

* * * * *